United States Patent [19]
Shou et al.

[11] Patent Number: 5,467,030
[45] Date of Patent: Nov. 14, 1995

[54] CIRCUIT FOR CALCULATING A MAXIMUM VALUE

[75] Inventors: Guoliang Shou; Weikang Yang; Wiwat Wongwarawipat; Sunao Takatori; Makoto Yamamoto, all of Tokyo, Japan

[73] Assignees: Yozan Inc.; Sharp Corporation, both of Tokyo, Japan

[21] Appl. No.: 322,408

[22] Filed: Oct. 12, 1994

Related U.S. Application Data

[63] Continuation of Ser. No. 986,767, Dec. 8, 1992, abandoned.

[30] Foreign Application Priority Data

Aug. 26, 1992 [JP] Japan ..................................... 4-252048

[51] Int. Cl.$^6$ .................................................. H03K 5/153
[52] U.S. Cl. .............................................. 327/58; 326/119
[58] Field of Search ..................................... 307/451, 448, 307/464, 243, 355, 351; 326/35, 36; 327/58, 62, 63

[56] References Cited

U.S. PATENT DOCUMENTS

| | | | |
|---|---|---|---|
| 4,613,772 | 9/1986 | Young | 307/448 |
| 4,621,207 | 11/1986 | Suganuma et al. | 307/451 |
| 4,896,059 | 1/1990 | Goodwin-Johannson | 307/464 |
| 5,003,196 | 5/1991 | Kawaguchi | 307/351 |

OTHER PUBLICATIONS

M. Bhansali and C. Munoz–Bustamante, IBM Technical Disclosure Bulletin, Maximum and Minimum Voltage Detection, Oct. 1984, vol. 27, No. 5, pp. 2908–2910.
Patent Abstracts of Japan, vol. 014, No. 525 (P–1132) Nov. 1990 re JP-A-22 21 870.
Patent Abstracts of Japan, vol. 016, No. 125 (P–1331) Mar. 1992 re JP-A-32 91 571.
Patent Abstracts of Japan, vol. 016, No. 365 (P–1397) Aug. 1992 re JP-A-41 13 275.
Patent Abstracts of Japan, vol. 11, No. 212 (E–522) (2659) Jul. 1987 re JP-A-62 034 417.
Patent Abstracts of Japan, vol. 11, No. 212 (E–522)(2659) Jul. 1987 re JP-A-62 034 416.
Patent Abstracts of Japan, vol. 5, No. 99 (E–63)(771) Jun. 1981 re JP-A-56 044 218.
Electronics Handbook, Electronic Society, May 18, 1975, pp. 1703–1704.
Handbook for the Most Use of Analog IC, CQ Publishing Kabushiki Kaisha, Jan. 20, 1992, pp. 135–142.

Primary Examiner—Edward P. Westin
Assistant Examiner—Andrew Sanders
Attorney, Agent, or Firm—Cushman, Darby & Cushman

[57] ABSTRACT

A calculating circuit for outputting a maximum value based on a plurality of inputs. The circuit is comprised of a plurality of nMOS transistors connected in a parallel configuration.

1 Claim, 1 Drawing Sheet

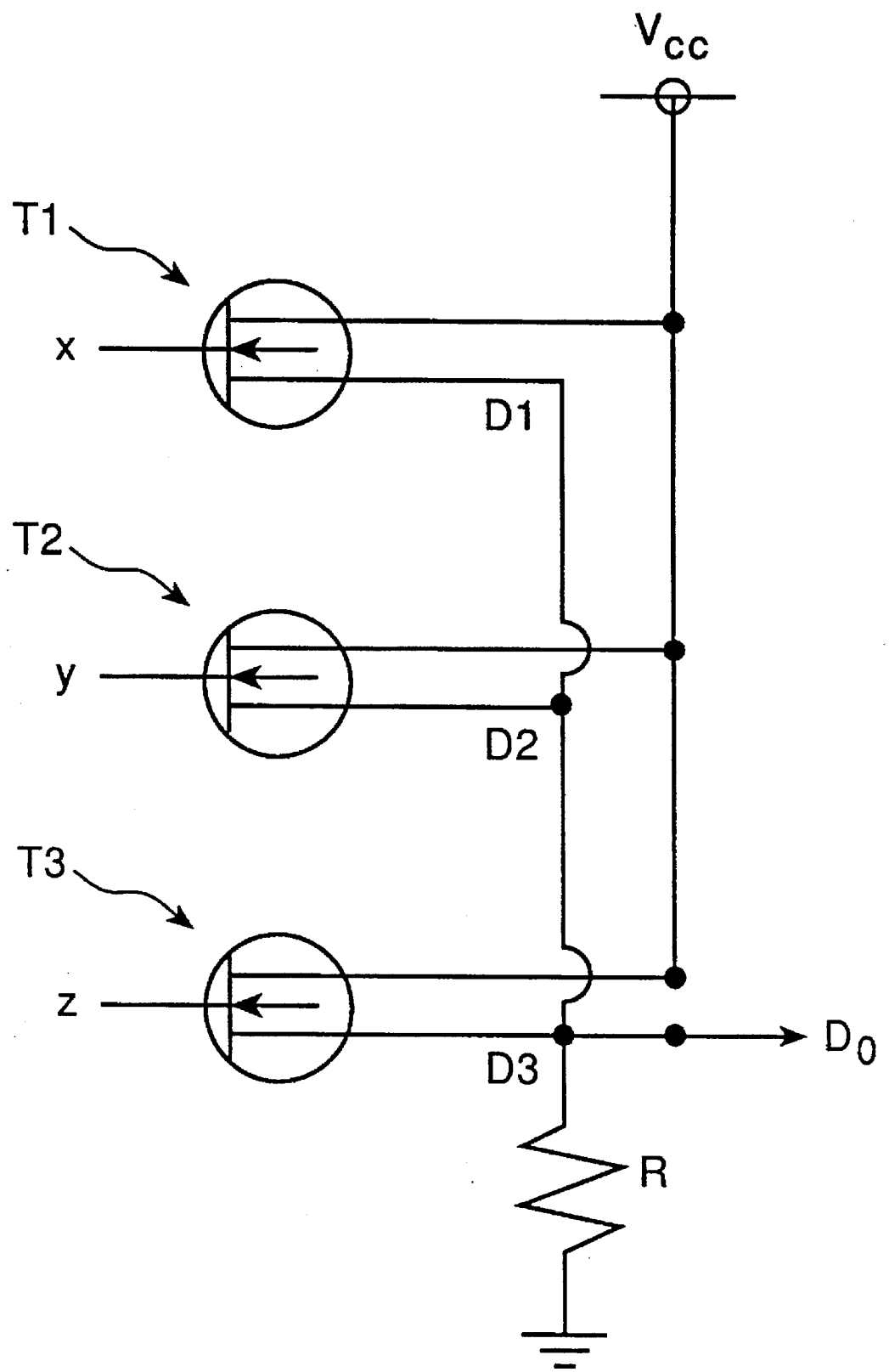

CIRCUIT FOR CALCULATING A MAXIMUM VALUE

This is a continuation of application Ser. No. 07/986,767, filed on Dec. 8, 1992.

BACKGROUND OF THE INVENTION

1. Field of the Invention

The present invention relates to a circuit which outputs a maximum value corresponding to one of a plurality of inputs.

2. Background of the Invention

The calculation of a maximum value of a plural number of data, has normally been performed by digital computers. A digital computer requires a rather large structure like comparison circuits and multiplexer. Moreover, a plurality of steps are required to obtain the maximum value when a digital computer is used.

SUMMARY OF THE INVENTION

The present invention solves the problems noted above and is a relatively small circuit which operates rather quickly.

The circuit for calculating a maximum value according to the present invention utilizes the switching characteristic of a plurality of nMOS field-effect transistors. The source follower output of nMOS transistors are connected to a common output. A plurality of input voltages is input to a corresponding gate of each nMOS transistor. Only the nMOS transistor receiving the maximum input becomes active, thereby generating a voltage at the source side of the nMOS transistors. In other words, the nMOS transistor which receives the maximum input becomes active while the others remain inactive.

BRIEF DESCRIPTION OF THE DRAWING

FIG. 1 shows a circuit of an embodiment according to the present invention.

PREFERRED EMBODIMENT

An embodiment of a circuit for calculating a maximum value will now be described with reference to FIG. 1.

In FIG. 1, the circuit for calculating a maximum value comprises a plurality of nMOS transistors ("T1", "T2" and "T3") in parallel. Input voltage "x", "y" and "z" are input to T1, T2 and T3, respectively. T1, T2 and T3 have source follower outputs D1, D2 and D3, respectively. These outputs are connected to a common output Do.

Each nMOS transistor has the characteristic as shown below when an output equivalent to the input voltage is generated at the source.

D1=x
D2=y
D3=z.

When the conditions are such that x>y and x>z, T1 activates and D1 becomes equivalent to x. Therefore, the source voltage of T2 and T3 is higher than their corresponding gate voltage. Consequently, T2 and T3 remain inactive and D1 is Do. The calculating circuit acts in a similar manner when y or z is the maximal value.

The above embodiment connects three nMOS transistors in parallel. It is possible to output a maximal input voltage for two or more input voltages by connecting a number of nMOS transistors equalling the number of inputs in parallel.

The time it takes to obtain the output is almost equal to the response time of the nMOS transistor having the maximum value. This is much quicker than it takes for a digital circuit to conduct the same calculation. Furthermore, the size of the circuit is very small, as is clear from the structure shown in FIG. 1.

As mentioned above, the circuit for calculating a maximum value is small in size and operates relatively quickly because the maximum value of each nMOS transistor is generated by the common output by connecting the source follower output of the nMOS transistors to the common output.

What is claimed is:

1. A circuit for outputting a maximum voltage of one of a plurality of inputs comprising:

a common output;

a resistance having a first terminal which is grounded and a second terminal; and a plurality of nMOS transistors, wherein each one of said plurality of nMOS transistors corresponds to one of said plurality of inputs, and wherein each said nMOS transistor comprises:

a transistor drain connected to a common power source;

a transistor source connected to said second terminal and to said common output; and a transistor gate connected to said corresponding one of said plurality of inputs; and wherein one of said plurality of transistors that receives a maximum voltage of said plurality of inputs conducts, causing said maximum input voltage to be applied to said source of each remaining transistor so that each remaining transistor becomes non-conductive because each gate voltage becomes lower than a source voltage for each remaining transistor, and wherein said nMOS transistors are connected within said circuit such that a minimal amount of current is drawn therethrough.

* * * * *